(12) United States Patent
Yuan

(10) Patent No.: US 11,302,614 B2
(45) Date of Patent: Apr. 12, 2022

(54) CHIP ON FILM AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Chuangui Yuan, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/638,762

(22) PCT Filed: Jan. 7, 2020

(86) PCT No.: PCT/CN2020/070733
§ 371 (c)(1),
(2) Date: Feb. 13, 2020

(87) PCT Pub. No.: WO2021/036160
PCT Pub. Date: Mar. 4, 2021

(65) Prior Publication Data
US 2021/0057316 A1    Feb. 25, 2021

(30) Foreign Application Priority Data

Aug. 23, 2019    (CN) .......................... 201910781225.8

(51) Int. Cl.
*H01L 23/498*    (2006.01)
*H01L 23/544*    (2006.01)

(52) U.S. Cl.
CPC .... *H01L 23/49811* (2013.01); *H01L 23/4985* (2013.01); *H01L 23/49838* (2013.01); *H01L 23/544* (2013.01); *H01L 2223/54426* (2013.01)

(58) Field of Classification Search
CPC ......... H01L 23/544; H01L 2223/54426; H01L 23/4985
See application file for complete search history.

(56) References Cited

U.S. PATENT DOCUMENTS 4,731,503 A * 3/1988 Kitanishi ............ G02F 1/13452
174/117 A
5,598,627 A * 2/1997 Saka ....................... H01R 12/62
174/72 A (Continued)

FOREIGN PATENT DOCUMENTS

CN    101146400 A    3/2008
CN    201789091 U    4/2011

(Continued)

*Primary Examiner* — Bilkis Jahan
*Assistant Examiner* — Victor V Barzykin
(74) *Attorney, Agent, or Firm* — Mark M. Friedman

(57) ABSTRACT

A chip on film and a display device are disclosed. One connection end of the chip on film is disposed with a pin to be compatible to at least one plug interface disposed at a connection end of a flexible printed circuit board. A pin connect method in which the pin and the plug interface are matched is adopted in the connection between the flexible printed circuit board and the chip on film, which optimizes the bonding process between the flexible printed circuit board and the chip on film and saves material cost and equipment cost required for thermal-compression of the anisotropic conductive film.

11 Claims, 4 Drawing Sheets

(56) References Cited

U.S. PATENT DOCUMENTS

| | | | |
|---|---|---|---|
| 6,773,269 B1 | 8/2004 | Downes | |
| 7,514,802 B2* | 4/2009 | Tetani | H01L 23/4985 257/797 |
| 2004/0159930 A1 | 8/2004 | Makita | |
| 2005/0139963 A1* | 6/2005 | Kang | H01L 23/4985 257/620 |
| 2005/0218513 A1* | 10/2005 | Seko | H01L 23/544 257/734 |
| 2008/0203563 A1* | 8/2008 | Takahashi | H01L 23/544 257/737 |
| 2010/0044871 A1* | 2/2010 | Katoh | H01L 23/4985 257/773 |
| 2014/0120749 A1 | 5/2014 | Drew et al. | |
| 2016/0172428 A1* | 6/2016 | Song | H01L 27/3276 257/99 |
| 2016/0181346 A1* | 6/2016 | Kwon | H01L 51/0097 257/40 |
| 2016/0188059 A1* | 6/2016 | Lee | G06F 3/04164 345/173 |
| 2017/0287814 A1* | 10/2017 | Kim | H01L 23/29 |
| 2017/0317439 A1 | 11/2017 | Zebhauser et al. | |
| 2018/0097199 A1* | 4/2018 | Jo | H01L 27/3276 |
| 2018/0292865 A1* | 10/2018 | Liao | G06F 1/1637 |
| 2019/0067406 A1* | 2/2019 | Lee | H01L 27/1262 |
| 2019/0116672 A1* | 4/2019 | Zhao | G01R 31/2818 |
| 2020/0092987 A1* | 3/2020 | Kim | H05K 1/147 |
| 2020/0105657 A1* | 4/2020 | Lee | H01L 23/4985 |
| 2020/0119476 A1* | 4/2020 | Hu | H05K 1/144 |
| 2020/0271979 A1* | 8/2020 | Roh | G02F 1/13452 |
| 2021/0066434 A1* | 3/2021 | Lee | H05K 1/111 |

FOREIGN PATENT DOCUMENTS

| | | |
|---|---|---|
| CN | 103796427 A | 5/2014 |
| CN | 204696278 U | 10/2015 |
| CN | 105137631 A | 12/2015 |
| CN | 206020868 U | 3/2017 |
| CN | 106790811 A | 5/2017 |
| CN | 107112661 A | 8/2017 |
| CN | 107507513 A | 12/2017 |
| CN | 107683020 A | 2/2018 |
| CN | 109379841 A | 2/2019 |
| CN | 208737129 U | 4/2019 |
| CN | 110636696 A | 12/2019 |
| JP | 2002280700 A | 9/2002 |

* cited by examiner

CHIP ON FILM AND DISPLAY DEVICE

FIELD OF INVENTION

The present invention relates to a display technology, and more particularly to a chip on film and a display device.

BACKGROUND

With the development of display technology, display technology has entered an era of flexible display. Organic light emitting diode (OLED) display technology is currently the mainstream flexible technology. At present, a majority of flexible screens need bonding between a chip on film (COF) and an OLED panel and bonding between a flexible printed circuit board (FPCB) and the COF. An external current is connected to the COF and the FPCB, and an internal circuit of the flexible screen is then conducted to achieve a display effect.

SUMMARY

Refer to FIG. 1 to FIG. 3, wherein FIG. 1 is a schematic diagram showing a film bonding process of an anisotropic conductive film in an existing bonding process, FIG. 2 is a schematic diagram showing bonding between a chip on film and an OLED panel in the existing bonding process, and FIG. 3 is a schematic diagram showing bonding between a flexible printed circuit board and a chip on film in the existing bonding process.

Specifically, the existing process flow of bonding is as follows: a first anisotropic conductive film (ACF) 12 is attached to an outer lead bonding (OLB) region 111 of an OLED panel 11 to complete the attaching process of the ACF, as shown in FIG. 1. Next, one end of the chip on film 21 is bonded with the OLB region 111 through the ACF 12 attached to the OLB region 111 to complete the bonding process between the chip on film and the OLED panel, as shown in FIG. 2. Then, a second anisotropic conductive film (ACF) 32 is attached to a bonding region 311 of the FPCB 31, and then the bonding region 311 of the FPCB 31 is bonded with the other end of the COF 21 through the second ACF 32 to complete the bonding process between the FPCB and the COF. The FPCB 31 can be folded to a back surface of the display panel 11, as shown in FIG. 3.

The ACFs mainly comprise a resin adhesive and conductive particles. The conduction principle is to use conductive particles to connect the electrodes between two components to make them conductive and to prevent two adjacent electrodes from being short-circuited to achieve the purpose of conducting only in the Z-axis direction and not conducting in the X and Y direction. Because a tool is used in the bonding process, the conductive particles of the anisotropic conductive film are laminated under certain process conditions such as pressing at a certain temperature, pressure, or for certain time, thereby connecting the components to achieve the display function.

However, the current production process is only applicable to thermally press the anisotropic conductive film to generate conductive particles to conduct the circuit since it is limited by materials of the chip on film and the FPCB. Since the manufacturing process of the conventional flexible printed circuit board is different from that of the chip on film, the thermal conductivity of the chip on film is relatively higher than that of the FPCB. Therefore, two kinds of anisotropic conductive films are needed. At the same time, the bonding process between the chip on film and the flexible printed circuit board is formed by pressing two kinds of flexible materials, so the accuracy is correspondingly poor, and the production process will be more complicated.

Therefore, how to optimize the bonding process between the chip on film and the flexible printed circuit board, how to save material and equipment costs, and how to improve product accuracy and yield have become urgent issues.

The purpose of the present application is to provide a chip-on film and a display device, which can optimize the bonding process of the chip-on film and a flexible printed circuit board, reduce costs of materials and tool, and improve product accuracy and yield.

In order to achieve the foregoing object of the present invention, an embodiment of the present invention provides a chip-on film, comprising a flexible film, wherein the flexible film comprises a first surface, and the first surface comprises a chip bonding area with a chip disposed in the chip bonding area; a first connection end, wherein the first connection end is disposed with at least one pin, a first insertion alignment mark, and a second insertion alignment mark, and wherein the first insertion alignment mark and the second insertion alignment mark are respectively disposed at both ends of an area where the pin is disposed, and the pin is used for electrically connecting a flexible printed circuit board; and a second connection end, the second connection end is disposed with at least a bonding pad, a first connection alignment mark, and a second connection alignment mark, and wherein the first connection alignment mark and the first connection alignment mark are respectively disposed at two ends of an area where the bonding pad is disposed, and the bonding pad is used for electrically connecting a display panel.

In order to achieve the foregoing object of the present invention, an embodiment of the present invention provides a chip-on film, comprising a flexible film, wherein the flexible film comprises a first surface, and the first surface comprises a chip bonding area with a chip disposed in the chip bonding area; and a first connection end, where the first connection end is disposed with at least one pin, and the pin is used for electrically connecting the flexible printed circuit board.

In order to achieve the foregoing object of the present invention, an embodiment of the present invention provides a display device, comprising a display panel, comprising an external lead-connection area; a chip-on film with a first connecting end of the chip-on film is disposed with at least one pin, and the second connecting end thereof is disposed with at least one bonding pad; a conductive connection layer, electrically connecting the bonding pad to the external lead-connection area; and a flexible printed circuit board, wherein a first connection end of the flexible printed circuit board is disposed with at least one plug interface, and the pin is inserted into the plug interface, thereby electrically connecting the flexible printed circuit board and the chip-on film.

In the bonding process of the display device of the present application, the flexible printed circuit board and the chip on film are connected by a pin and a plug interface. There is no need to form an anisotropic conductive film between the flexible printed circuit board and the chip on film, so forming the conductive particles of the anisotropic conductive film does not require a tool for thermally pressing the flexible printed circuit board nor undergo process conditions such as pressing at a certain a certain temperature, pressure, or for certain time, and the production process will not be affected by the limitation of materials of the flexible printed circuit board.

The display device of the present application optimizes the bonding process between the flexible printed circuit board and the chip on film, improves the line conduction accuracy and yield of the flexible printed circuit board and the chip on film, saves material cost of the anisotropic conductive film and the equipment cost required for thermal compression, and improves the accuracy and yield of products of the display device.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
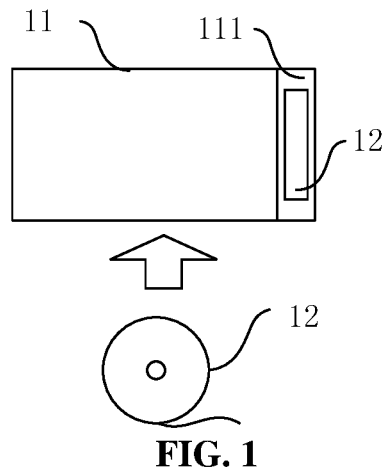
FIG. 1 is a schematic diagram of attaching an anisotropic conductive film in a conventional bonding process.

Please refer to the drawings, in which the same reference numerals represent the same components. The following description is based on specific embodiments of the present invention as illustrated and should not be construed as limiting the specific embodiments that are not described herein.

The terms "first", "second", "third", etc. (if present) in the description and claims of the present application and the drawings are used to distinguish similar objects, and are not necessarily used to describe a specific order or a sequence. It is understood that the objects described are interchangeable where appropriate. The terms "comprising" and "having" and any variants of them, so as to cover non-exclusive inclusion.

In this application, unless stated and defined otherwise, the first feature "above" or "below" the second feature may comprise direct contact between the first and second features, and may also comprise the first and second features. The features are not in direct contact but are contacted by another feature between them. Moreover, the first feature is "above" "above" "above" the second feature, and comprises that the first feature is directly above and obliquely above the second feature, or merely indicates that the first feature has a higher level than the second feature. The first feature is "below", "below", and "below" of the second feature, and comprises that the first feature is directly below and obliquely below the second feature, or only indicates that the first feature has a lower level than the second feature.

The following disclosure provides many different implementations or examples for implementing different structures of the present application. To simplify the disclosure of this application, the components and settings of specific examples are described below. Of course, they are merely examples and are not intended to limit the application. This application may repeat reference numerals and/or reference letters in different examples, and such repetition is for simplicity and clarity, and does not itself indicate a relationship between the various embodiments and/or settings discussed. In addition, examples of various specific processes and materials are provided in this application, but those of ordinary skill in the art may be aware of the application of other processes and/or the use of other materials.

Figure 4:
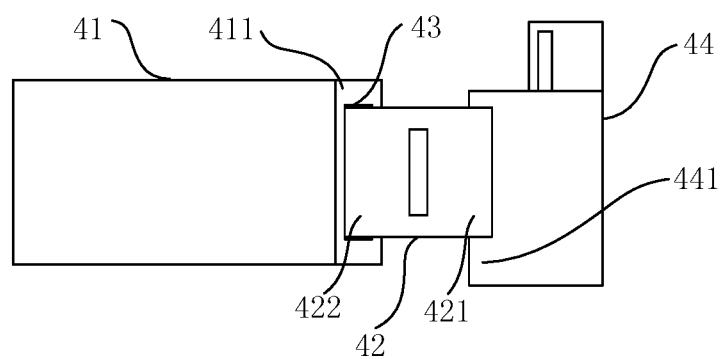
FIG. 4 is a schematic structural diagram of a display device of the present application.

Please refer to FIG. 4, which is a schematic diagram of a display device of the present application. The display device comprises a display panel 41 comprising an external lead-connection area 411, a chip on film 42 with a first connection end 421 disposed with at least one pin 5121 (shown in FIG. 5A) and a second connecting end 422 disposed with at least one bonding pad 5131 (shown in FIG. 5A), a conductive connection layer 43 electrically connecting the bonding pad 5131 to the external lead-connection area 411, and a flexible printed circuit board 44. A first connection end 441 of the flexible printed circuit board 44 is disposed with at least one plug interface 6111 (shown in FIG. 6A), and the plug pin 5121 is inserted into the plug interface 6111, thereby electrically connecting the flexible printed circuit board 44 and the chip on film 42.

The display panel 41 can be an organic light-emitting diode (OLED) panel or a liquid crystal display (LCD) panel, and the external lead-connection area 411 is exposed with a metal bonding pad.

Preferably, the conductive connection layer 43 is an anisotropic conductive film. The anisotropic conductive film mainly comprises resin adhesive and conductive particles. The conduction principle is to use conductive particles to connect the electrodes between two components to make them conductive and to prevent two adjacent electrodes from being short-circuited, thereby achieving the purpose of conduction only in the Z-axis direction but not in the X and Y directions. By thermal pressing with a tool and undergoing certain process conditions such as pressing at a certain temperature, pressure, or for certain time, the conductive particles of the anisotropic conductive film are pressed and bonded to conduct each of the components.

Figure 2:
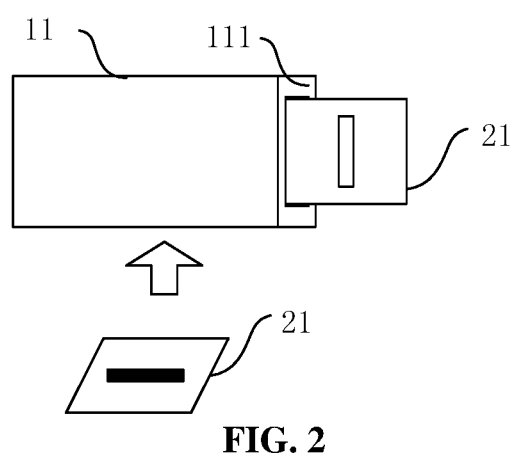
FIG. 2 is a schematic view of bonding between a chip on film and an OLED panel in a conventional bonding process.
Figure 3:
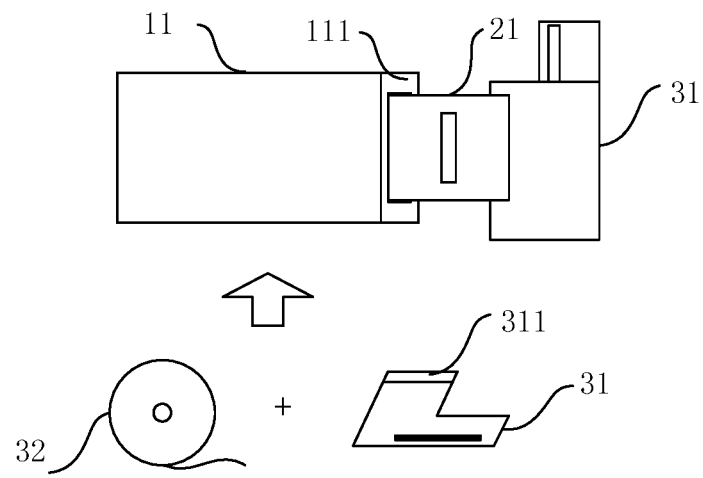
FIG. 3 is a schematic diagram of bonding between a flexible printed circuit board and a chip on film in a conventional bonding process.

Specifically, the production process for bonding in the present application is as follows: first attach an anisotropic conductive film to the external lead-connection area 411 of the display panel 41 to complete an anisotropic conductive film attaching process (refer to FIG. 1). Next, one end of the chip on film 42 on which the bonding pad 5131 is provided is bonded with the external lead-connection area 411 through the anisotropic conductive film to complete a bonding process between the chip on film and the display panel (See FIG. 2). Next, the pin 5121 of the chip on film 42 is inserted into the plug interface 6111 of the flexible printed circuit board 44 by manually inserting or using an insertion jig to grasp the alignment mark (Mark), thereby electrically connecting the flexible printed circuit board 44 to the chip on film 42 to complete the bonding process between the flexible printed circuit board and the chip on film and obtaining the structure shown in FIG. 4.

A pin connect method in which the pin and the plug interface are matched is adopted in the bonding process of the display device of the present application, the connection between the flexible printed circuit board and the chip on film. There is no need to form an anisotropic conductive film between the flexible printed circuit board and the chip on film, need, so forming the conductive particles of the anisotropic conductive film does not require a tool for thermally pressing the flexible printed circuit board nor undergo process conditions such as pressing at a certain a certain temperature, pressure, or and for certain time, and the production process will not be affected by the limitation of materials of the flexible printed circuit board.

The display device of the present application optimizes the bonding process between the flexible printed circuit board and the chip on film, improves the circuit conduction accuracy and yield of the flexible printed circuit board and the chip on film, saves material cost and equipment cost required for thermal-compression of the anisotropic conductive film, and improves accuracy and yield of products of the display device.

Figure 5A:
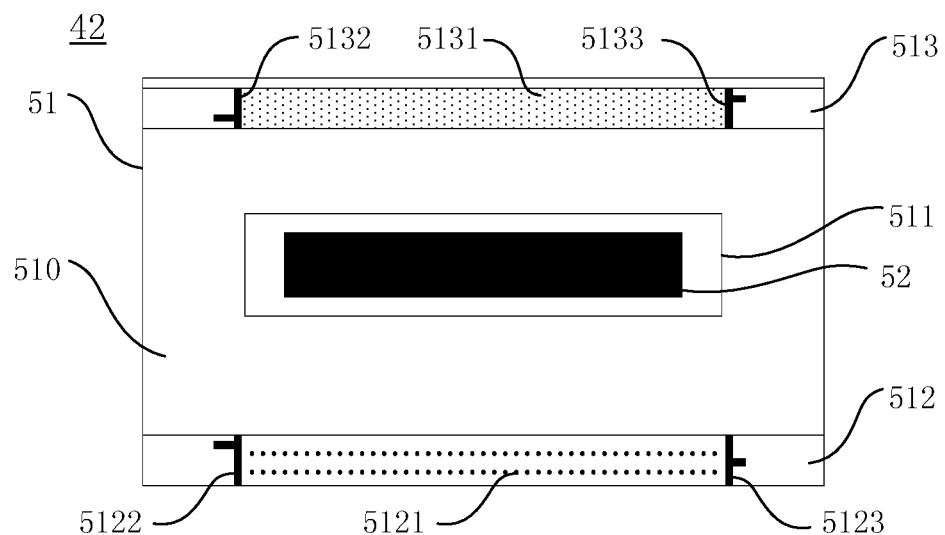
FIG. 5A is a schematic structural diagram of an embodiment of a chip on film.
Figure 5B:
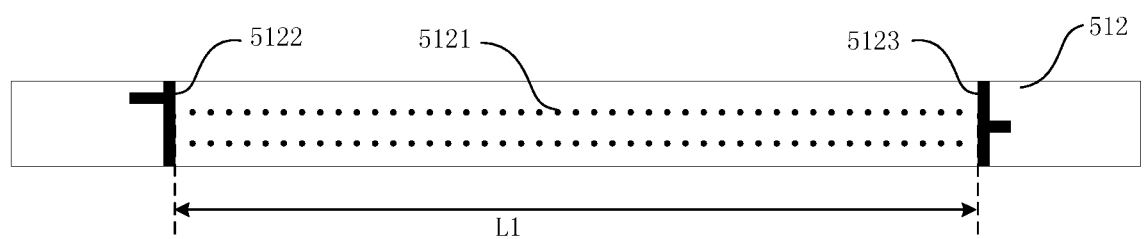
FIG. 5B is an enlarged schematic view of a first connection end in FIG. 5A.

Refer to FIG. 5A to FIG. 5B, wherein FIG. 5A is a schematic structural diagram of an embodiment of a chip on film, and FIG. 5B is an enlarged schematic view of a first connection end in FIG. 5A. The chip on film 42 comprises a flexible film 51, and the flexible film 51 comprises a first surface 510. The first surface 510 comprises a chip bonding area 511 and a first connection end 512. A chip 52 is disposed in the chip bonding area 511. The first connecting end 512 is disposed with at least one pin 5121, and the pin 5121 is used to electrically connect the flexible printed circuit board 44 (shown in FIG. 4).

Specifically, the first connection terminal 512 is further disposed with a first insertion alignment mark 5122 and a second insertion alignment mark 5123, wherein the first insertion alignment mark 5122 and the second insertion alignment mark 5123 is respectively disposed at both ends of an area where the pin 5121 is disposed so that the alignment mark can be grasped and aligned by manual insertion or by using a insertion jig. A first pitch L1 is defined between the first insertion mark 5122 and the second insertion mark 5123.

Preferably, the first insertion alignment mark 5122 and the second insertion alignment mark 5123 have different shapes so as to prevent misidentification and operation. The shapes of the alignment marks at both ends are different, and the main function thereof is error-proof. When manually pressing, the pin damage resulting from mis-operation (when rotating 180°) can be prevented, or the pin damage caused by misidentification can be prevented when using the jig to automatically pressing.

Specifically, the first surface 510 further comprises a second connection end 513. The second connection end 513 comprises a bonding pad 5131, which is used to electrically connect the display panel. The bonding pad 5131 may be bonded with an external lead-connection area of the display panel through an anisotropic conductive film, so the chip on film is electrically connected to the display panel.

Specifically, the second connection end 513 is further disposed with a first connection alignment mark 5132 and a second connection alignment mark 5133, wherein the first connection alignment mark 5132 and the second connection alignment mark 5133 are respectively disposed at both ends of the area where the bonding pad 5131 is disposed so that the alignment mark can be grasped by the pressing tool for alignment crimping. Preferably, the first connection alignment mark 5132 and the second connection alignment mark 5133 are different in shape so as to prevent misidentification and mis-operation when the pressing tool grasps the alignment marks.

Figure 6A:
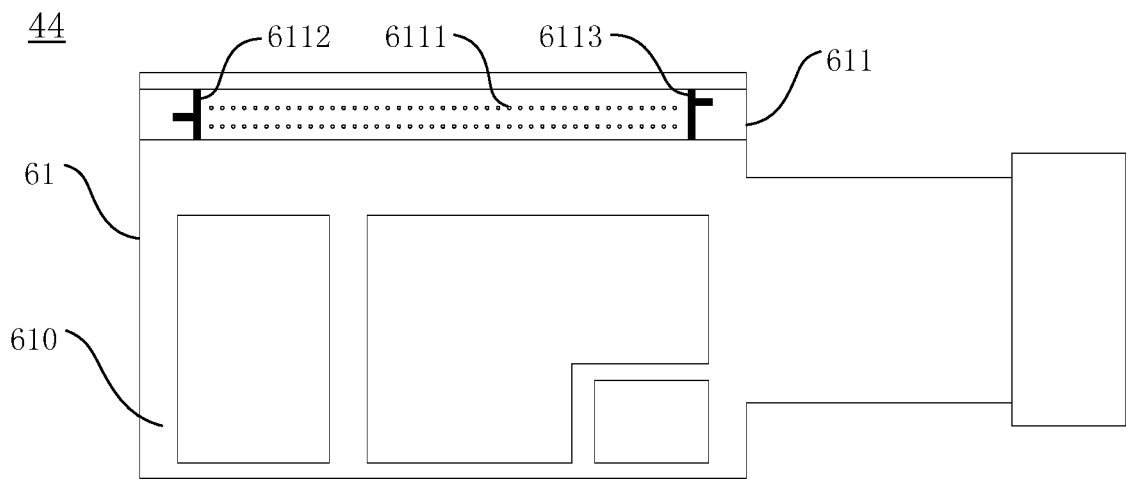
FIG. 6A is a schematic structural diagram of an embodiment of a flexible printed circuit board of the present application.
Figure 6B:
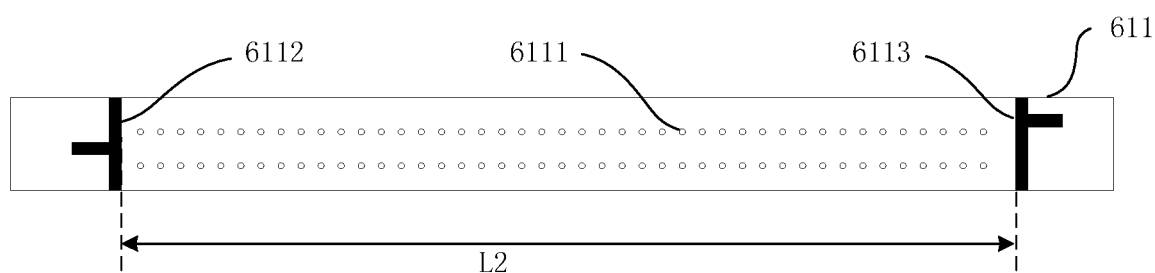
FIG. 6B is an enlarged schematic view of a first connection end in FIG. 6A.

Refer to FIG. 6A to FIG. 6B, wherein FIG. 6A is a schematic structural diagram of an embodiment of a flexible printed circuit board of the present application, and FIG. 6B is an enlarged schematic diagram of a first connection end in FIG. 6A. The flexible printed circuit board 44 comprises a substrate 61, wherein the substrate 61 comprises a first surface 610. The first surface 610 comprises a first connection end 611, and the first connection end 611 is disposed with at least one plug interface 6111 which is compatible with the pin 5121 of the chip on film 42 shown in FIGS. 5A-5B and is configured to receive the pin 5121. In the process of bonding a flexible printed circuit board and a chip on film, the flexible printed circuit board 44 and the chip on film 42 are electrically connected by inserting the pin 5121 into the plug interface 6111.

Specifically, the first connection end 611 is further disposed with a first interface alignment mark 6112 and a second interface alignment mark 6113, wherein the first interface alignment mark 6112 and the second interface alignment mark 6113 are respectively disposed at both ends of an area where the plug interface 6111 is located, so the mark can be captured by manual plugging or by using a plug jig.

Preferably, the first interface alignment mark 6112 and the second interface alignment mark 6113 have different shapes so as to prevent misidentification and mis-operation. The shapes of the alignment marks at both ends are different, and the main function is error-proof. When manually pressing, the pin damage resulting from mis-operation (when rotating 180°) can be prevented, or the pin damage caused by misidentification can be prevented when using the jig to automatically press.

Specifically, the first interface alignment mark 6112 and the second interface alignment mark 6113 comprises a second pitch L2. The second pitch L2 is the same as the first pitch L1 shown in FIG. 5B. Therefore, it is ensured that the plug interface 6111 of the flexible printed circuit board 44 is compatible with the pin 5121 of the chip on film 42.

It should be noted that the substrate 61 of the flexible printed circuit board 44 further comprises other components required for the circuit board to function, such as components, circuit traces, stiffeners, protective films, and the like. The setting method can refer to the existing process, and will not be repeated here.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A chip on film, comprising a flexible film, wherein the flexible film comprises a first surface, and the first surface comprises:
   a chip bonding area with a chip disposed in the chip bonding area;
   a first connection end, wherein the first connection end is disposed with a plurality of pins, a first alignment mark, and a second alignment mark, wherein the first alignment mark and the second alignment mark are respectively disposed at both ends of an area where the plurality of pins are disposed, and the plurality of pins are configured to be received by a plurality of plug interfaces of a flexible printed circuit board, thereby electrically connecting the flexible printed circuit board and the chip on film by inserting the plurality of pins into the plurality of plug interfaces correspondingly; and a second connection end, wherein the second connection end is disposed with at least a bonding pad, a first connection alignment mark, and a second connection alignment mark, wherein the first connection alignment mark and the second connection alignment mark are respectively disposed at two ends of an area where the bonding pad is disposed, and the bonding pad used for electrically connecting a display panel.

2. The chip on film according to claim 1, wherein a shape of the first alignment mark is different from a shape of the second alignment mark.

3. The chip on film according to claim 1, wherein a shape of the first connection alignment mark is different from a shape of the second connection alignment mark.

4. A display device, comprising:
a display panel, comprising an external lead-connection area;
a chip on film with a first connection end disposed with a plurality of pins and a second connection end disposed with at least one bonding pad;
a conductive connection layer electrically connecting the bonding pad to the external lead-connection area; and
a flexible printed circuit board, wherein a first connection end of the flexible printed circuit board is disposed with a plurality of plug interfaces, and the plurality of pins are inserted into and received by the plurality of plug interfaces correspondingly, thereby electrically connecting the flexible printed circuit board and the chip on film.

5. The display device according to claim 4, wherein:
a first alignment mark and a second alignment mark are also disposed at a first connection end of the chip-on film, and the first alignment mark and a second alignment mark are respectively disposed at both ends of an area where the plurality of pins are disposed; and
a first interface alignment mark and a second interface alignment mark are also disposed at a first connection end of the flexible printed circuit board, wherein the first interface alignment mark and the second interface alignment mark are respectively disposed at both ends of an area where the plurality of plug interfaces are disposed.

6. The display device according to claim 5, wherein:
a first pitch is defined between the first alignment mark and the second alignment mark; and
a second pitch is defined between the first interface alignment mark and the second interface alignment mark,
wherein the first pitch is equal to the second pitch.

7. The display device according to claim 5, wherein a shape of the first alignment mark is different from a shape of the second alignment mark.

8. The display device according to claim 5, wherein a shape of the first interface alignment mark is different from a shape of the second interface alignment mark.

9. The display device according to claim 4, wherein:
a first connection alignment mark and a second connection alignment mark are also disposed at the second connection end of the chip on film, wherein the first connection alignment mark and the second connection alignment mark are respectively disposed at two ends of an area where the bonding pad is located.

10. The display device according to claim 9, wherein a shape of the first connection alignment mark is different from a shape of the second connection alignment mark.

11. The display device according to claim 4, wherein the conductive connection layer is an anisotropic conductive adhesive film.

* * * * *